United States Patent
Poyner et al.

(10) Patent No.: US 11,031,581 B1
(45) Date of Patent: Jun. 8, 2021

(54) SPUTTERING DEPOSITION OF AN ANODE MATERIAL AND CATHODE MATERIAL FROM A SINGLE TARGET SOURCE THAT ARE NANOSTRUCTURED AND ELECTROCHEMICALLY COUPLED FOR MANUFACTURING OF LITHIUM ION BATTERIES

(71) Applicant: The University of Tulsa, Tulsa, OK (US)

(72) Inventors: Mark Poyner, Jacksonville, FL (US); Dale Teeters, Sand Springs, OK (US)

(73) Assignee: The University of Tulsa, Tulsa, OK (US)

( * ) Notice: Subject to any disclaimer, the term of this patent is extended or adjusted under 35 U.S.C. 154(b) by 226 days.

(21) Appl. No.: 16/265,371

(22) Filed: Feb. 1, 2019

Related U.S. Application Data

(60) Provisional application No. 62/625,771, filed on Feb. 2, 2018.

(51) Int. Cl.

| | |
|---|---|
| *H01M 4/04* | (2006.01) |
| *H01M 4/131* | (2010.01) |
| *H01M 4/525* | (2010.01) |
| *H01M 4/1391* | (2010.01) |
| *C23C 14/08* | (2006.01) |
| *C23C 14/34* | (2006.01) |
| *H01M 10/0525* | (2010.01) |

(52) U.S. Cl.
CPC ......... *H01M 4/0426* (2013.01); *C23C 14/085* (2013.01); *C23C 14/34* (2013.01); *H01M 4/131* (2013.01); *H01M 4/1391* (2013.01); *H01M 4/525* (2013.01); *H01M 10/0525* (2013.01); *H01M 2300/0082* (2013.01)

(58) Field of Classification Search
None
See application file for complete search history.

(56) References Cited

U.S. PATENT DOCUMENTS

| | | |
|---|---|---|
| 6,586,133 B1 | 7/2003 | Teeters et al. |
| 7,736,724 B1 | 6/2010 | Johnson et al. |
| 8,574,744 B1 | 11/2013 | Teeters et al. |
| 9,601,747 B2 | 3/2017 | Teeters et al. |

OTHER PUBLICATIONS

Guo, Bing et al., Nanostructured Co3O4 Materials: Synthesis, Characterization, and Electrochemical Behaviors as Anode Reactants in Rechargeable Lithium Ion Batteries, J. Phys. Chem. C 2010, 114, 29, 12805-12817.

(Continued)

*Primary Examiner* — Wyatt P McConnell
(74) *Attorney, Agent, or Firm* — Head, Johnson, Kachigian & Wilkinson, PC

(57) ABSTRACT

A process of sputter deposition of both a cathode material and an anode material from a single target source. The process includes the steps of deposition sputtering on a porous substrate from a lithiated metal oxide target source to produce an anode. In addition, deposition sputtering on a porous substrate from the same lithiated metal oxide target source is utilized to produce a cathode. A nanostructured battery may be produced having a metal oxide anode and a lithiated metal oxide cathode, wherein the anode and the cathode are generated from a single target source.

16 Claims, 7 Drawing Sheets

(56) References Cited

OTHER PUBLICATIONS

Johnson, Paige L. et al., Formation and characterization of SnO2 nanobaskets, Solid State Ionics, 2006, 177, 2821-2825.

Kang, Yong-Mook et al., A study on the charge-discharge mechanism of Co3O4 as an anode for the Li ion secondary battery, Electrochimica Acta 2005, 50, 3667-3673.

Kim, Han-Ki et al., Electrochemical and structural properties of radio frequency sputtered cobalt oxide electrodes for thin-film supercapacitors, Journal of Power Sources 2001, 102 (1-2), 167-171.

Liu, Yan et al., Hydrothermal synthesis of Co3O4 microspheres as anode material for lithium-ion batteries, Electrochimica Acta 2008, 53 (5), 2507-2513.

Mohtashami, H., Nanostructured Silicon Anodes for Lithium Ion Batteries, The University of Tulsa, Tulsa, Oklahoma, 2011.

Ohzuku, Tsutomu et al., Why transition metal (di) oxides are the most attractive materials for batteries, Solid State Ionics 1994, 69 (3-4), 201-211.

Smith, Matthew R. et al., Interfacial storage of lithium in the nanostructure of SnO2 nanobaskets for capacities exceeding theoretical values, Solid State Ionics 2012, 225, 680-684.

Wang, Ying et al., A nanocrystalline Co3O4 thin film electrode for Li-ion batteries, Thin Solid Films 2003, 441 (1-2), 19-24.

Wu, Zhong-Shuai et al., Graphene Anchored with Co3O4 Nanoparticles as Anode of Lithium Ion Batteries with Enhanced Reversible Capacity and Cyclic Performance, ACS Nano 2010, 4, 6, 3187-3194.

SPUTTERING DEPOSITION OF AN ANODE MATERIAL AND CATHODE MATERIAL FROM A SINGLE TARGET SOURCE THAT ARE NANOSTRUCTURED AND ELECTROCHEMICALLY COUPLED FOR MANUFACTURING OF LITHIUM ION BATTERIES

CROSS REFERENCE

This application claims priority to and the benefit of U.S. Provisional Patent Application Ser. No. 62/625,771, filed Feb. 2, 2018, which is incorporated herein in its entirety by reference.

BACKGROUND OF THE INVENTION

Field of the Invention

The present invention is directed to the field of lithium ion batteries. In particular, the present invention is directed to a nanostructured battery wherein both a cathode material and an anode material are generated from a single target source.

Description of the Related Art

Secondary battery technologies, such as lithium (Li) ion batteries, are used in numerous applications all over the world. The high energy density, rate performance, and cyclabilities have made Li ion technology the rechargeable battery of choice for electronics, energy harvesting, and the electric vehicle markets. As computing capabilities increase, the demand for more capable and better performing power sources increases as well. There is interest in discovering new, high capacity electrode couples, as well as using the unique chemical and physical properties of high surface area nanomaterials, to achieve enhanced Li ion battery performance.

While lithium metal has one of the highest specific capacity values of 3,860 mAh/g (milli amp hour/gram), the use of lithium metal as an anode material in rechargeable battery technology is limited. This limitation is partially due to safety concerns when using metallic lithium. The extreme reactivity produces high capacities, but is often times difficult to control in a battery system. As a result, new classes of compounds have been employed to replace the lithium metal anode. Implementation of intercalation material has resulted in replacement of metallic lithium from lithium metal based batteries.

Lithium cobalt oxide ($LiCoO_2$) has emerged as a preferred cathode material used in lithium (Li) ion batteries. The layered structure of $LiCoO_2$, seen in FIG. 1, is a major benefit to cell cycling and performance and has helped make $LiCoO_2$ a preferred positive electrode in Li ion systems. By maintaining the layered hexagonal lattice, Li ions are able to intercalate into and out of the interstitial spaces without inducing major structural change to the electrode. This again is a characteristic of a topotactic reaction (a chemical solid-state reaction where the reactant's structure does not significantly change upon the addition of another material) and a characteristic of an intercalation material. Improved Li ion intercalation properties allow the material to store more charge, and maintain higher capacities. Along with a high specific theoretical capacity of 273 mAh/g, $LiCoO_2$ also has a higher operating voltage vs Li, (4-5 V). [1] Using $LiCoO_2$ as a cathode material allows for Li ion cells to be produced exhibiting high capacity and energy density, along with excellent cyclability.

The ability to produce both a cathode and an anode from the same target source material results in increased manufacturing efficiency. It is possible to produce large areas of both cathode material and anode material in a continuous manufacturing process. One non-limiting example of an application of the present invention is for large scale manufacture of batteries.

Accordingly, it is a principal object and purpose of the present invention to provide a nanostructured battery wherein both a cathode material and an anode material are generated from a single target source.

It is a further object and purpose of the present invention to provide a process of sputter deposition of both an anode and a cathode from a single target source is chemically altered during deposition.

It is a further object and purpose of the present invention to provide a battery having a metal oxide anode and a lithiated metal oxide cathode wherein both the anode and the cathode are generated from a single target source material.

SUMMARY OF THE INVENTION

The present invention is directed to a nanostructured battery and to a process of sputter deposition of both a cathode material and an anode material from a single target source for manufacturing of batteries.

The process includes the steps of deposition sputtering on a substrate from a metal oxide target source to produce an anode. In one preferred embodiment, the process includes the steps of deposition sputtering on an alumina substrate from a lithium cobalt oxide ($LiCoO_2$) target source in order to produce an anode.

The process also includes the steps of deposition sputtering on a substrate from a metal oxide target source to produce a cathode. In one preferred embodiment, the process includes the steps of deposition sputtering on an alumina substrate surface from a lithium cobalt oxide ($LiCoO_2$) target source to produce a cathode. The steps of deposition sputtering to produce a cathode and deposition sputtering to produce an anode are performed at low power in a high pressure, oxygen saturated environment.

The substrate may be an anodized aluminum oxide (AAO) filter disc having a plurality of pores, each of the plurality of pores having a diameter of from about 1 nanometer (nm) to about 10 micrometers ($\mu$m).

The present invention is also directed to a battery having a metal oxide anode and a lithiated metal oxide cathode wherein the anode and the cathode are generated from a single source.

In one preferred embodiment, the nanostructured battery of the present invention includes a cobalt oxide ($Co_3O_4$) anode, a lithium cobalt oxide ($LiCoO_2$) cathode, and a layer of electrolyte therebetween. The nanostructured battery may have a diameter of from about 1 nanometers (nm) to about 10 micrometers ($\mu$m).

DETAILED DESCRIPTION OF THE INVENTION

The embodiments discussed herein are merely illustrative of specific manners in which to make and use the invention and are not to be interpreted as limiting the scope.

While the invention has been described with a certain degree of particularity, it is to be noted that many modifications may be made in the details of the invention's construction and the arrangement of its components without departing from the scope of this disclosure. It is understood that the invention is not limited to the embodiments set forth herein for purposes of exemplification.

Nanostructuring of thin films results in an increase in surface area over traditional thin films. In the present invention, a lithiated metal oxide target source is utilized. In a preferred embodiment of the present invention, $LiCoO_2$ is nanostructured to make novel electrode systems. Radio Frequency (RF) magnetron sputter coating is used to achieve this. Sputter coating is a line of sight deposition technique. Therefore, if a textured surface is exposed during the sputtering process, the deposited layer on the surface of the substrate will template or take on the underlying texture. The result will be a thin-film of the target material with the same texture of the substrate. This is a useful technique, as it allows for nanoengineering of thin-film materials. Considering battery applications, this characteristic of sputter coating is of extreme importance when fabricating nanostructured electrodes. Nanostructured substrates, such as nanoporous anodized aluminum (AAO) membranes, can act as templates for nanostructured Li ion electrodes. Aluminum oxide ceramic material is electrically insulating and doesn't contribute unwanted problems due to electrical conductivity.

Common electrode materials such as tin oxide ($SnO_2$), silicon (Si), and $LiCoO_2$, can be sputter coated using a RF magnetron sputtering system. [2,3] Thin-films of these electrode materials can be deposited on the AAO substrate and effectively template the nanoporous-like nature of the membrane. The result of this fabrication is a Li ion electrode material with an approximately 200 nm diameter nanoporous structure.

Figure 1:
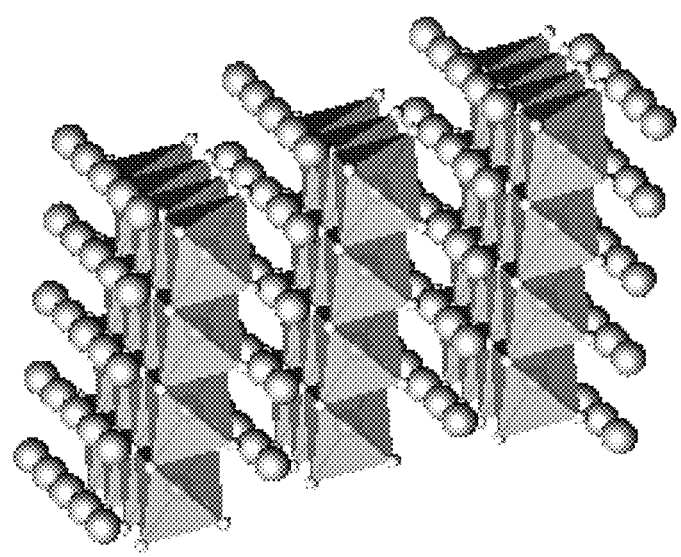
FIG. 1 is an illustration of a structure of lithium cobalt oxide ($LiCoO_2$), which structure is known.
Figure 2:
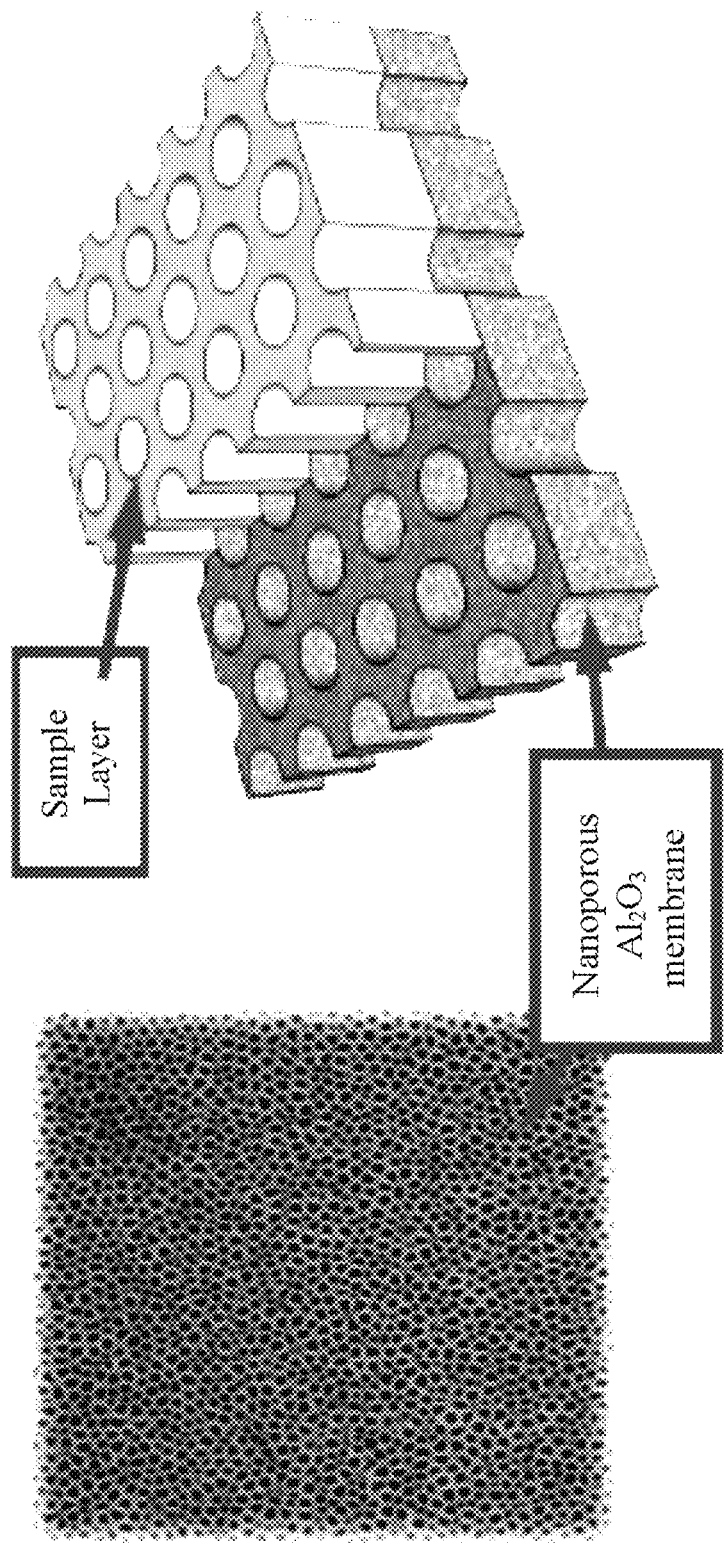
FIG. 2 illustrates an alumina membrane along with a membrane with a sample layer deposited by sputtering in accordance with the present invention.

FIG. 2 illustrates two views—an overhead or top view and an enlarged partially cut-away view. FIG. 2 shows the nanoporous-like nature of an AAO membrane and the ability to correctly template the nanoporous feature by radio frequency (RF) magnetron sputtering. The presence of nanopores increases the surface area. FIG. 2 is an image of an overhead view of the AAO membrane, the same orientation that the deposition will coat during the sputtering process. The sputtered film templates the nanoporous-like nature of the AAO membrane and the result is a nanostructured thin-film electrode.

Through maintaining this nanoporous feature, high surface area $LiCoO_2$ cathodes can be fabricated.

Cobalt oxide species have generated interest as a new anode material in lithium (Li) batteries due to the high specific capacity of 890 mAh/g. [4] This capacity value is higher than graphite of 372 mAh/g, the most commonly used anode material in lithium batteries, and even higher than $SnO_2$ of 781 mAh/g, an anode material used in previous work in Applicant's lab. Nanostructuring $Co_3O_4$ has been researched previously with high capacity results, anchoring the oxide with graphene has improved anode performance. [5,6] Reactive sputtering of a cobalt target to produce a high capacity $Co_3O_4$ anode material is possible and has been performed in the literature. [7]

Figure 3:
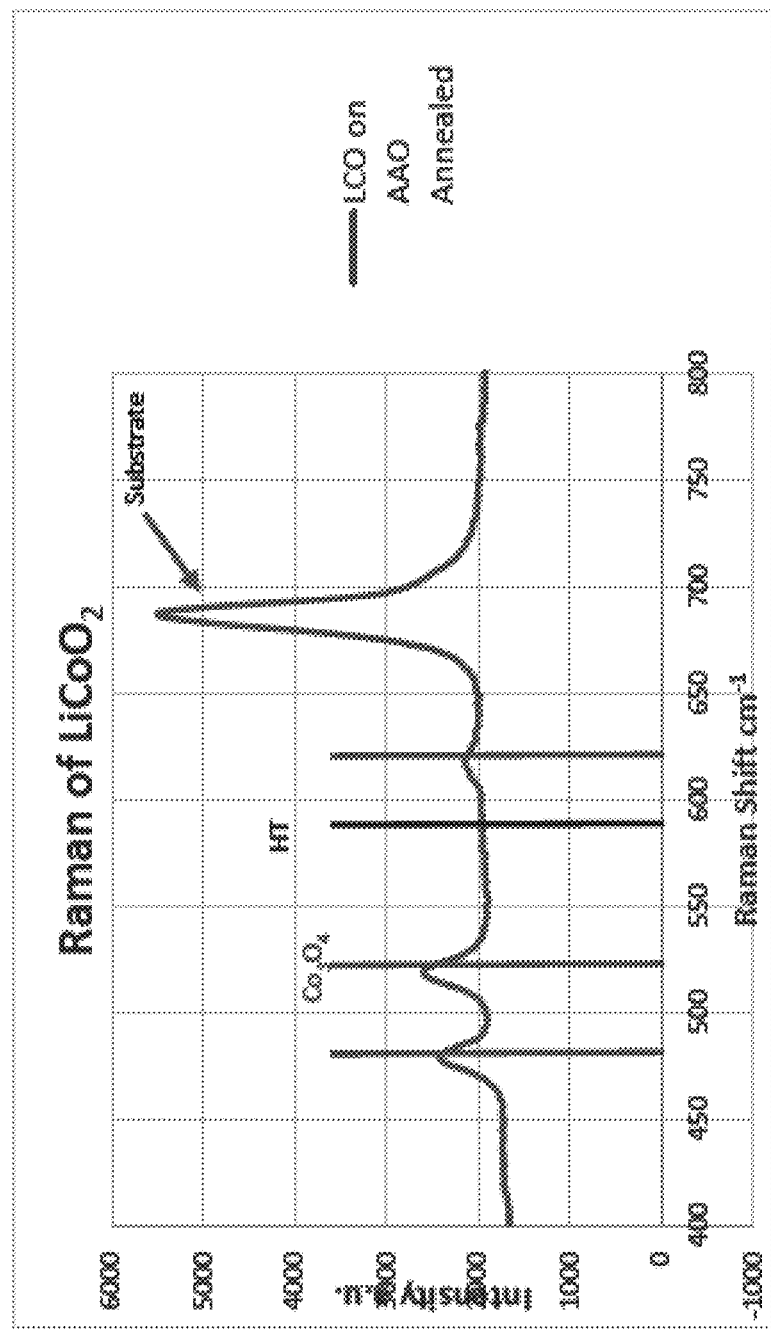
FIG. 3 is a chart of Raman spectra collected from a nanostructured sample.

It is also possible to deposit $Co_3O_4$ from a $LiCoO_2$ target source by delithiating the traditional cathode material. Li can be lost during the sputtering deposition process. This is why $LiCoO_2$ targets are oftentimes made with an excess of Li. The Li can be lost during low power sputtering operations or, possibly, when contaminated by oxygen gas during the deposition process. We have shown that we can sputter delithiated $LiCoO_2$ with the same nanostructure we have described in the literature as a "nanobasket" and for which Applicant holds a patent. [8,9,10,11,12] The delithiated $LiCoO_2$ was characterized with Raman spectroscopy, which is a spectroscopic technique used to provide information on molecular vibrations and crystal structures. The results of the Raman spectroscopic work are shown in FIG. 3, where it was determined that $Co_3O_4$ was sputtered on an alumina substrate from a $LiCoO_2$ target. This was accomplished by sputtering at low power, high pressure, and oxygen saturated sputtering environment, resulting in a delithiated $Co_3O_4$ sample.

FIG. 3 is a chart of Raman spectra data collected from a nanostructured $LiCoO_2$ sample sputtered at low power, high pressure, and oxygen saturated sputtering environment, resulting in a delithiated $Co_3O_4$ sample. It is believed that sputtering may be accomplished under a wide range of power, pressure, and oxygen conditions.

The Raman spectra collected and presented shows the ability to deposit a delithiated $Co_3O_4$ sample from a $LiCoO_2$ cathode source. While $Co_3O_4$ is not a cathode material like its lithiated counterpart $LiCoO_2$, it is of importance in battery work because it is a high capacity anode material, i.e. the complementary electrode to $LiCoO_2$ that is needed to fabricate a battery system. This provides the capability to deposit both high capacity anode and cathode materials from a single target source. The manufacturing capabilities associated help improve throughput processes and increase production rates for batteries. Changes to the sputtering conditions in the chamber can lead to major changes in the cycling performance of an electrode material. By controlling the conditions of the sputtering environment, it is possible to change the chemical composition of the sputtered material.

The concept of fabricating a high capacity electrode by reactively sputter coating $Co_3O_4$ on an anodized aluminum oxide (AAO) membrane may be used to develop a Li ion anode material with enhanced performance. In this process, delithiated sputter coating of $LiCoO_2$ to form $Co_3O_4$ has been used to first make an anode for testing under half-cell conditions, and then a complete battery system.

To determine performance, galvanostatic half-cell cycling studies were performed. First, half-cell cycling half-cells were constructed to determine the cycling performance of the $Co_3O_4$ anode formed by sputtering. Initial half-cell cycling profiles are presented in FIG. 4. The images display the charge-discharge cycling profiles of a $Co_3O_4$ anode half-cell.

Figure 4:
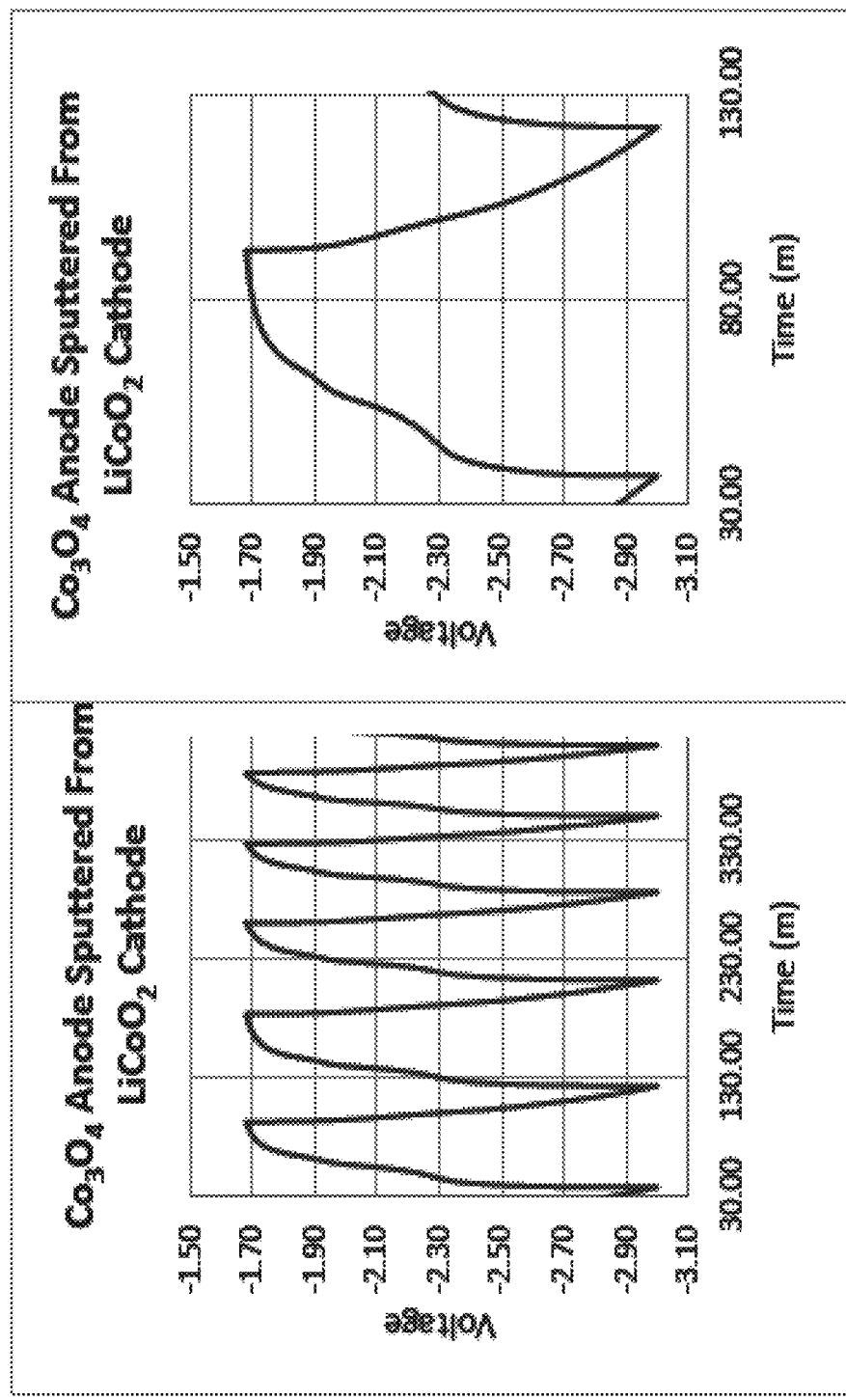
FIG. 4 are charts of the cycling performance of cobalt oxide ($Co_3O_4$) anode.

The cycling profiles in FIG. 4 display the anodic behavior of $Co_3O_4$ with classic battery like behavior. The noticeable inflections on both the charge and discharge processes indicate Li storage in a battery behavior. The preliminary results on the specific discharge capacities achieved with this nanostructured $Co_3O_4$ species cycled in a half-cell configuration are shown in the chart in FIG. 5.

Figure 5:
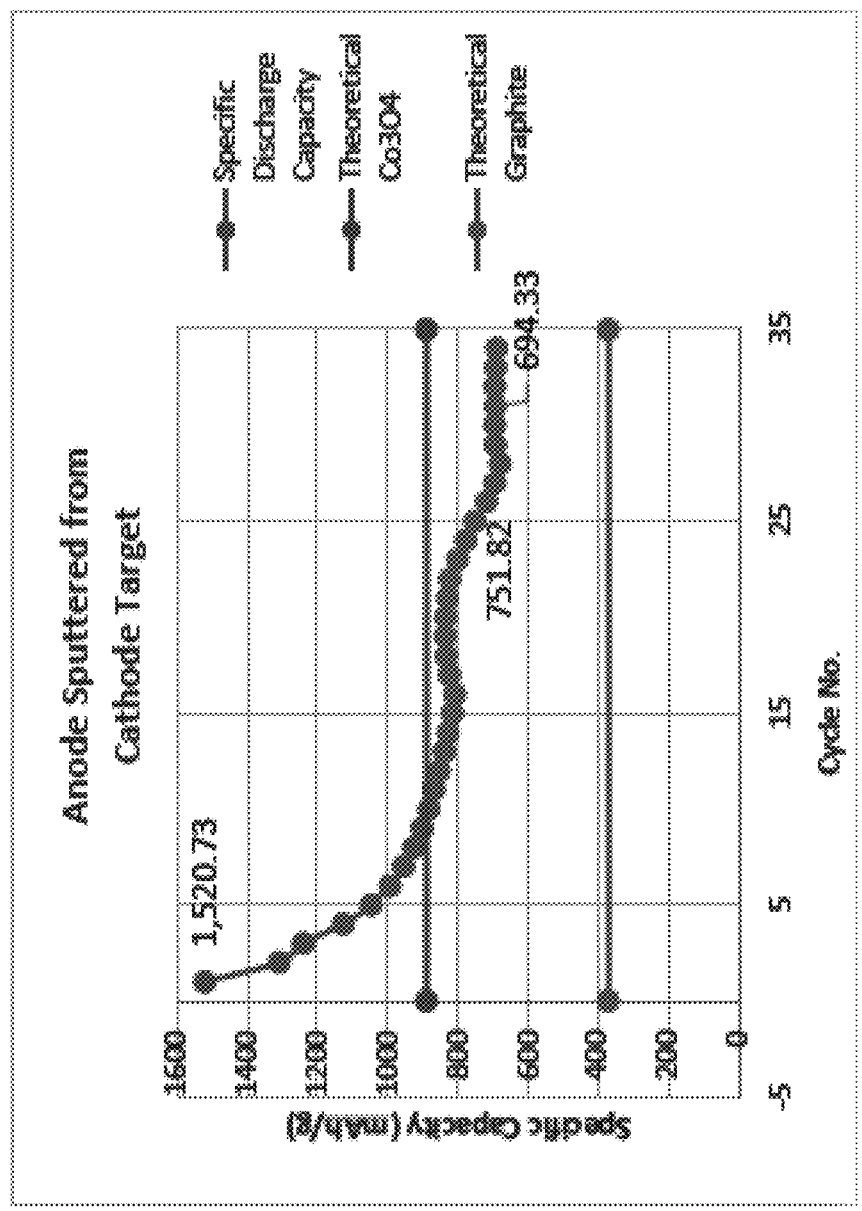
FIG. 5 is a chart showing half-cell cycling performance of a nanostructured anode.

FIG. 5 is a chart showing the half-cell cycling performance of the nanostructured $Co_3O_4$ anode sputtered from a $LiCoO_2$ cathode target. Specific capacity is shown on the y-axis with cycle numbers on the x-axis.

Similar to both nanostructured $SnO_2$ and $LiCoO_2$ electrodes, the nanostructured $Co_3O_4$ anode displays specific capacities that exceed the theoretical of 890 mAh/g. These values have also been present in the literature and are characteristic of nanoscale $Co_3O_4$ anodes. [13,14] These higher than theoretical capacity values of the nanostructured $Co_3O_4$ samples make the material an attractive new high capacity anode material for a Li ion cell.

The next test made complete cells using $LiCoO_2$ and $Co_3O_4$ using this new method of the present invention. This was done by using a single material for the target, $LiCoO_2$, and chemically altering the composition during the deposition process to deposit both anode and cathode materials, demonstrating the present invention to not only produce new electrode couples (in this case $LiCoO_2/Co_3O_4$), but also to do so in a unique manufacturing method. To prove this, prototype batteries were made. Batteries produced in accordance with the present invention may have a diameter of between 1 nanometer (nm) to about 10 micrometers (µm).

Figure 6:
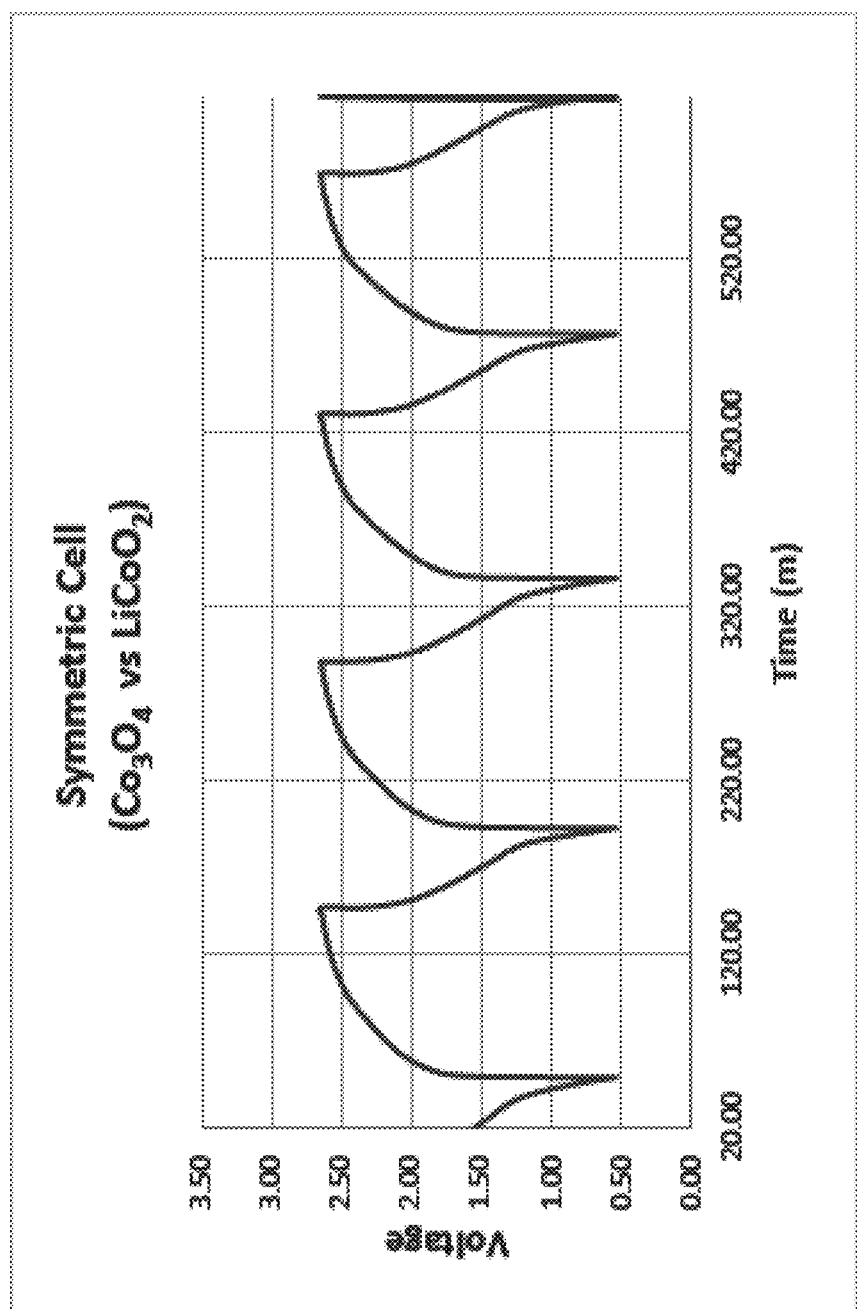
FIG. 6 is a chart showing cycling profile of a $Co_3O_4$ versus $LiCoO_2$ electrode couple.

Initial full-cell cycling profiles of a unique and novel electrode couple between $Co_3O_4$ versus $LiCoO_2$ with both electrodes being deposited from a single source are presented in FIG. 6.

FIG. 6 is a chart showing the cycling profile of the $Co_3O_4$ versus $LiCoO_2$ electrode couple. Voltage is shown in the Y-axis while time is displayed on the X-axis.

Cycled in the 1M $LiClO_4$ in PC liquid electrolyte, the $Co_3O_4$ deposited from a $LiCoO_2$ source was coupled with a $LiCoO_2$ cathode and successfully cycled, producing a new Li ion cell chemistry with classic battery cycling behavior. The specific discharge capacities of the unique cell are presented in FIG. 7.

Figure 7:
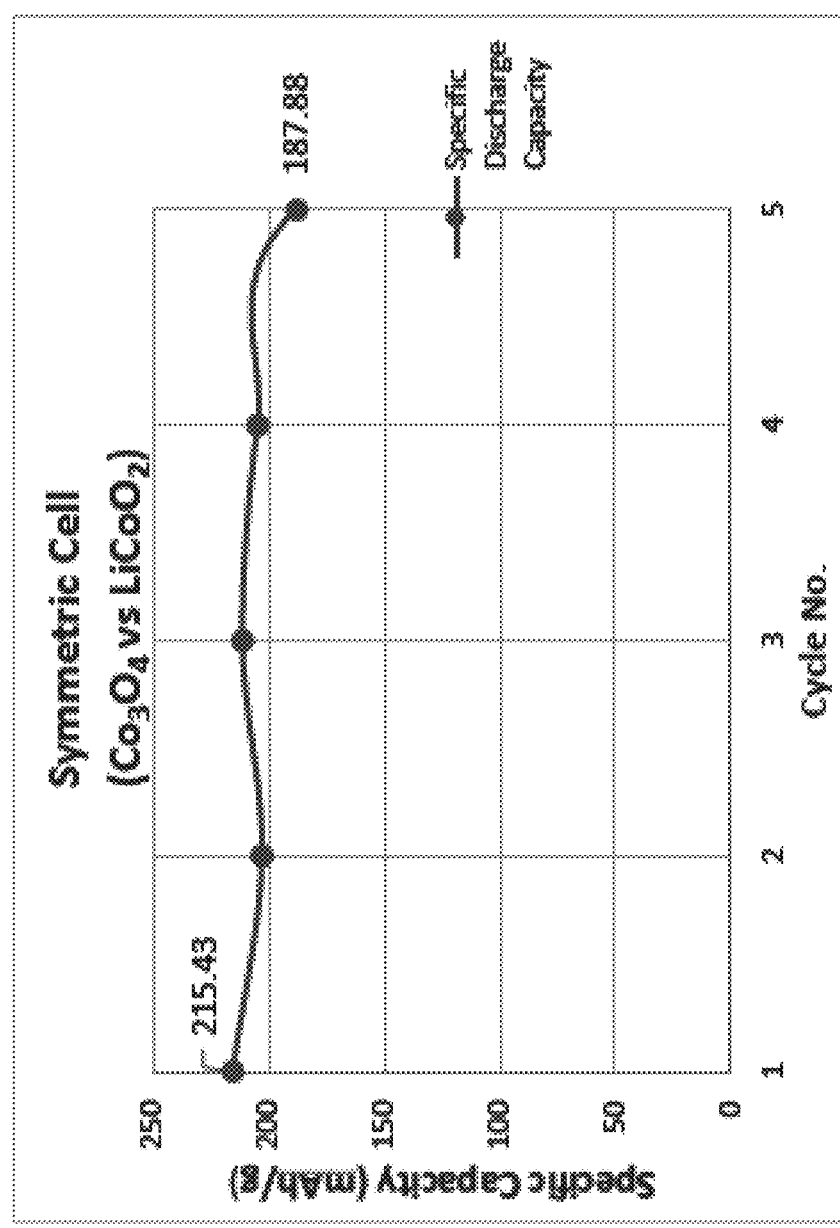
FIG. 7 is a chart showing full-cell cycling data of a $Co_3O_4$ versus $LiCoO_2$ cell for a battery produced in accordance with the present invention.

FIG. 7 is a chart showing full-cell cycling data of a $Co_3O_4$ versus $LiCoO_2$ cell with specific discharge capacity values ranging from 215 to 188 mAh/g.

The full-cell cycling performance of this $Co_3O_4$ versus $LiCoO_2$ cell, coined $LiCoO_2$ Symmetric Cell, rivals the performance of the nanostructured $SnO_2$ versus $LiCoO_2$ full-cell. This is understandable, as both the nanostructured $SnO_2$ and $Co_3O_4$ had values ranging from 1500-700 mAh/g, and have the same half-cell operating voltage window (0-3 V). It is therefore reasonable that the full-cell performances of two anode materials with similar capacity values and operating voltages, when coupled in a full-cell against the same $LiCoO_2$ cathode material, would have a similar electrochemical performance. Like the nanostructured $SnO_2$ versus $LiCoO_2$ full-cell, the $LiCoO_2$ Symmetric Cell displays cycling behavior and performance that rivals and exceeds the commercial standard. The unique manufacturing and economic benefits derived from reactive sputter coating and the ability to deposit both anode and cathode materials from a single source, makes the electrode couple of $Co_3O_4$ versus $LiCoO_2$ a viable and new Li ion battery technology.

Other potential oxides that could be formed and used as anodes are $Fe_2O_3$, $Fe_3O_4$, CoO, $MnO_xO_y$, $Cu_2O/CuO$, NiO, $Cr_2O_3$, $RuO_2$, $MoO_2/MoO_3$, $V_2O_3/V_2O_5$. In each case, lithium might be used with any of these metal oxides to produce a cathode.

In summary, the present invention provides a process to produce a nanostructured battery by deposition sputtering of an anode and deposition sputtering of a cathode from a single target source material. The single target source material is chemically altered during deposition.

The present invention also provides a nanostructured battery having a metal oxide anode and a lithiated metal oxide cathode, wherein the anode and the cathode are generated from a single source.

Whereas, the invention has been described in relation to the drawings attached hereto, it should be understood that other and further modifications, apart from those shown or suggested herein, may be made within the scope of this invention.

BIBLIOGRAPHY

[1] Ohzuku, T., Ueda, Atsushi, Why transition metal (di) oxides are the most attractive materials for batteries, *Solid State Ionics* 1994, 69 (3-4), 201-211.

[2] Mohtashami, H., Nanostructured Silicon Anodes for Lithium Ion Batteries, The University of Tulsa, Tulsa, Okla., 2011.

[3] Smith, M. R.; Johnson, P. L.; Teeters, D., Interfacial storage of lithium in the nanostructure of $SnO_2$ nanobaskets for capacities exceeding theoretical values, *Solid State Ionics* 2012, 225, 680-684.

[4] Yong-Mook Kang, M.-S. S., Jin-Ho Kim, Hyun-Seok Kim, Min-Sik Park, Jai-Young Lee, H. K. Liu, S. X. Dou, A study on the charge-discharge mechanism of $Co_3O_4$ as an anode for the Li ion secondary battery, *Electrochimica Acta* 2005, 50, 3667-3673.

[5] Bing Guo, Chunsheng Li, and Zhong-Yong Yuan, Nanostructured $Co_3O_4$ Materials: Synthesis, Characterization, and Electrochemical Behaviors as Anode Reactants in Rechargeable Lithium Ion Batteries, *J. Phys. Chem. C* 2010, 114, 12805-12817.

[6] Wu, Z.-S.; Ren, W.; Wen, L.; Gao, L.; Zhao, J.; Chen, Z.; Zhou, G.; Li, F.; Cheng, H.-M., Graphene Anchored with $Co_3O_4$ Nanoparticles as Anode of Lithium Ion Batteries with Enhanced Reversible Capacity and Cyclic Performance, *ACS Nano* 2010, 4 (6), 3187-3194.

[7] Kim, H.-K.; Seong, T.-Y.; Lim, J.-H.; Ii Cho, W.; Soo Yoon, Y., Electrochemical and structural properties of radio frequency sputtered cobalt oxide electrodes for thin-film supercapacitors, *Journal of Power Sources* 2001, 102 (1-2), 167-171.

[8] Johnson, P. L. and Teeters, D, Formation and Characterization of $SnO_2$ Nanobaskets, *Solid State Ionics,* 2006, 177, 2821.

[9] U.S. Pat. No. 7,736,724, "Fabrication of Nanobaskets by Sputter Deposition on Porous Substrates and Uses Thereof," Paige Lea Johnson and Dale Teeters, The University of Tulsa, 2010.

[10] U.S. Pat. No. 6,586,133 "Nanobattery Systems," D. C. Teeters, N. Korzhova and S. L. Fisher, The University of Tulsa, 2003.

[11] U.S. Pat. No. 8,574,744, "Nanoscale three-dimensional battery architecture," Dale Teeters and Paige Lea Johnson, The University of Tulsa, Tulsa Okla., 2017.

[12] U.S. Pat. No. 9,601,747, "Nanopatterned Substrate Serving as Both a Current Collector and Template for Nanostructured Electrode Growth," Dale Teeters and Matthew Smith, The University of Tulsa, Tulsa Okla., 2017.

[13] Wang, Y., Fu, Zheng-Wen, Qin, Qi-Zong, A nanocrystalline $Co_3O_4$ thin film electrode for Li-ion batteries, *Thin Solid Films* 2003, 441 (1-2), 19-24.

[14] Liu, Y., Mi, Changhuan, Su, Linghao, Zhang, Xiaogang, Hydrothermal synthesis of $Co_3O_4$ microspheres as anode material for lithium-ion batteries, *Electrochimica Acta* 2008, 53 (5), 2507-2513.

What is claimed is:

1. A process of sputter deposition of both a cathode material and an anode material from a single target source, which process comprises:
    deposition sputtering on a substrate from a lithiated metal oxide target source to produce an anode; and
    deposition sputtering on said substrate from said lithiated metal oxide target source to produce a cathode.

2. A process of sputter deposition as set forth in claim 1 wherein said deposition sputtering on a substrate from a lithiated metal oxide target source produces a metal oxide anode and a lithiated metal oxide cathode.

3. The process of sputter deposition as set forth in claim 1 wherein said lithiated metal oxide target source is lithium cobalt oxide ($LiCoO_2$).

4. The process of sputter deposition as set forth in claim 3 wherein said lithiated metal oxide target source is chemically altered during deposition.

5. A process as set forth in claim 1 wherein said substrate has a plurality of pores, each of said plurality of pores having a diameter of from about 1 nm to about 10 micrometers.

6. A process as set forth in claim 1 wherein said substrate is an alumina substrate.

7. A process as set forth in claim 6 wherein said alumina substrate is an anodized aluminum oxide (AAO) filter disc.

8. A process of sputter deposition as set forth in claim 1 including the additional step of producing a battery from said cathode and said anode.

9. A process of sputter deposition of both a cathode material and an anode material from a single target source, which process comprises:
    deposition sputtering on a first substrate from a lithiated metal oxide target source to produce an anode; and
    deposition sputtering on a second substrate from said lithiated metal oxide target source to produce a cathode.

10. A process of sputter deposition as set forth in claim 9 wherein said deposition sputtering from a lithiated metal oxide target source produces a metal oxide anode and a lithiated metal oxide cathode.

11. The process of sputter deposition as set forth in claim 9 wherein said lithiated metal oxide target source is lithium cobalt oxide ($LiCoO_2$).

12. The process of sputter deposition as set forth in claim 11 wherein said lithiated metal oxide target source is chemically altered during deposition.

13. The process as set forth in claim 9 wherein said first substrate and said second substrate each have a plurality of pores, each of said plurality of pores having a diameter of from about 1 nm to about 10 micrometers.

14. The process as set forth in claim 9 wherein said first substrate and said second substrate each is an alumina substrate.

15. The process as set forth in claim 14 wherein said alumina substrate is an anodized aluminum oxide (AAO) filter disc.

16. The process of sputter deposition as set forth in claim 9 including the additional step of producing a battery from said cathode and said anode.

* * * * *